United States Patent
Mulligan et al.

[19]

[11] Patent Number: 6,164,633
[45] Date of Patent: Dec. 26, 2000

[54] MULTIPLE SIZE WAFER VACUUM CHUCK

[75] Inventors: Vincent P. Mulligan, Port Ewen; Charles R. Tompkins, Jr., Poughkeepsie; Wing Fung Yuen, Fishkill, all of N.Y.

[73] Assignee: International Business Machines Corporation, Armonk, N.Y.

[21] Appl. No.: 09/315,380

[22] Filed: May 18, 1999

[51] Int. Cl.[7] ................................................ B25B 11/00
[52] U.S. Cl. .......................................... 269/21; 269/900
[58] Field of Search ............................ 269/21, 900, 279, 269/296, 286

[56] References Cited

U.S. PATENT DOCUMENTS

| | | | |
|---|---|---|---|
| 4,131,267 | 12/1978 | Ono et al. | 269/21 |
| 4,448,404 | 5/1984 | Ogawa et al. | 269/21 |
| 5,191,218 | 3/1993 | Mori et al. | 269/21 |
| 5,324,012 | 6/1994 | Aoyama et al. | 269/21 |
| 5,564,682 | 10/1996 | Tsuji | 269/21 |
| 6,032,997 | 3/2000 | Elliott et al. | 269/21 |

*Primary Examiner*—James G. Smith
*Assistant Examiner*—Lee Wilson
*Attorney, Agent, or Firm*—Steven Capella; Cantor Colburn LLP

[57] ABSTRACT

A vacuum holding chuck is presented. The vacuum holding chuck of the present invention is particularly well suited for holding semiconductor wafers of multiple diameters during various testing and manufacturing operations. In an exemplary embodiment, the vacuum chuck comprises a body having a first surface and an opposing second surface, wherein the first surface includes first and second recessed circular platforms to receive wafers having first and second diameters, respectively. The second surface includes at least one recessed circular platform to receive a wafer having a third diameter. Each circular platform is defined at least in part by an annular shoulder and each circular platform further includes a vacuum trough which is connected to a vacuum source which when activated, evacuates the air from the vacuum trough and securely holds a wafer in place within the circular platform.

22 Claims, 9 Drawing Sheets

MULTIPLE SIZE WAFER VACUUM CHUCK

FIELD OF THE INVENTION

The present invention relates to chucks for holding wafers during various manufacturing or testing operations. More specifically, the present invention relates to a chuck for holding multiple sized semiconductor wafers.

BACKGROUND OF THE INVENTION

Wafers that are currently used in the semiconductor industry are typically placed on a fixture during a manufacturing process to allow the wafer to be positioned and aligned properly so that a manufacturing procedure or testing procedure may be conducted thereon. For example, often the wafer is tooled to meet certain predetermined specifications as part of the overall manufacturing process and after manufacture, the wafer is tested to see if the wafer meets certain guidelines, e.g., quality control and performance standards.

Wafer holding chucks have taken various forms in the prior art, including the use of a vacuum holding chuck apparatus for chucking an article like a plate, a box, or a wafer. In a simple embodiment, a vacuum holding chuck includes a generally planar surface having a central opening which is connected to a vacuum source, by either an external tube or by disposing at least one internal vacuum passageway within the chuck itself, whereby the vacuum source is connected to the internal passageway leading to a vacuum port. The article (e.g., wafer) is placed on the planar support surface and when the vacuum apparatus is actuated, the vacuum evacuates the air resulting in the wafer being held on the chuck securely. One variant of this type of wafer holding chuck is an apparatus having a plurality of vacuum ports dispersed throughout the planar support surface which receives the article. All of the vacuum ports are connected to the vacuum source so that when actuated, the article is drawn toward and held against the planar support surface by the vacuum. The rationale is that by increasing the number of vacuum ports, the multiple vacuum ports act on the article in multiple locations causing the article to be securely held in place.

Additionally, other known wafer holding chucks secure the article by using a number of suction cups pressed against a predetermined surface area of the article to be chucked and the air in the suction cups is evacuated, whereby the article is chucked by the suction created by the vacuum chuck apparatus.

While there are several apparatuses and methods of chucking an article, the success achieved by each apparatus in securely holding the article against the planar support surface has not been entirely satisfactory. This is especially true for wafer holding chucks which are intended to hold wafers and particularly semiconductor wafers during a manufacturing process and/or testing procedure. One of the associated disadvantages of the prior chucks is that in many instances the chucks do not provide an apparatus which securely holds the article (e.g, wafer) on the chuck very well. In chucks having an inadequate number of vacuum ports or inadequate vacuum distribution over the wafer surface to be chucked, the wafer is not sufficiently held in place so as to prevent undesired movement thereof, which would encumber and likely render ineffective either a manufacturing procedure or a testing procedure of the wafer. This undesired movement of the wafer on the planar support surface results from vibration or shaking of the wafer during or more of the above-listed events.

Another of the associated disadvantages of prior wafer holding chucks is that typically, the chucks have a single side for receiving the wafer with this single side including the planar support surface to which the wafer is applied. Wafers of varying diameter are placed on the planar support surface and most chucks are not specifically designed to accommodate wafers of varying diameters but instead the wafers are held in place by placing the wafer over a number of vacuum ports and there are no guides provided to properly align the wafer.

Another disadvantage is that improper placement of the wafer on the planar support surface or improper chucking of the wafer can lead to warping of the wafer itself. If the air is improperly evacuated from the chuck and the wafer thereon, the tendency for the wafer to warp is greatly increased resulting in less precision in the manufacturing and testing of the wafer. In other words, when the wafer is placed on the planar support surface, there is an amount of air which exists between the bottom surface of the wafer and the planar support surface. When the vacuum is applied to the chuck, this pocket of air will cause the wafer to warp or bulge due to the trapped air underneath this portion of the wafer during evacuation of the surrounding air by the vacuum.

Other wafer holding chucks have complicated designs which utilize a number of clamping devices to pinch the edges of the wafer to the planar support surface to securely position the wafer thereon. These chucks have the associated disadvantage that they offer a more complex design involving additional components which results in a more costly and complex apparatus and a more time consuming procedure to securely hold the wafer to the chuck during the desired process or procedure.

SUMMARY OF THE INVENTION

The above-discussed and other drawbacks and deficiencies of the prior art are overcome or alleviated by the vacuum holding chuck of the present invention. The vacuum holding chuck of the present invention is particularly well suited for holding semiconductor wafers of multiple diameters during various testing and manufacturing operations. In an exemplary embodiment, the vacuum chuck comprises a body having a first surface and an opposing second surface, wherein the first surface includes first and second recessed circular platforms to receive wafers having first and second diameters, respectively. The second surface includes at least one recessed circular platform to receive a wafer having a third diameter. Each circular platform is defined at least in part by an annular shoulder and each circular platform further includes a vacuum trough which is connected to a vacuum source which when activated, evacuates the air from the vacuum trough and securely holds a wafer in place within the circular platform.

By providing a dual working surface chuck, the vacuum chuck of the present invention offers a simple and low cost vacuum chuck which is intended to receive and hold multiple size wafers to permit testing, e.g., inspection procedures, and manufacturing operations to be conducted on the wafer. Whether the first or second surface faces upward away from the fixture to which the vacuum chuck is typically mounted will depend upon the size of the wafer. If access to the other surface is desired, the vacuum chuck is simply turned over so that the reverse surface faces upward away from the fixture.

In another aspect of the present invention, each circular platform preferably includes an alignment pin which serves to locally locate a wafer disposed on the circular platform. The alignment engages a notch in the wafer so that the wafer is accurately and uniformly positioned on the circular platform. This is important in testing procedures, such as an inspection process, where the wafer is probed to evaluate the condition and quality of the wafer. Typically, these probes are computer driven in accordance with a coordinate system which allows the probe to be positioned at a desired, precise location on the wafer for evaluation thereof.

In another embodiment, the vacuum chuck of the present invention comprises a dual sided vacuum chuck, wherein each side includes a circular vacuum trough and a plurality of radial vacuum troughs. At least one of the radial vacuum troughs directly communicates with the circular vacuum trough so that the radial vacuum troughs in combination with the circular vacuum trough securely hold the wafer in place on the support surface.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
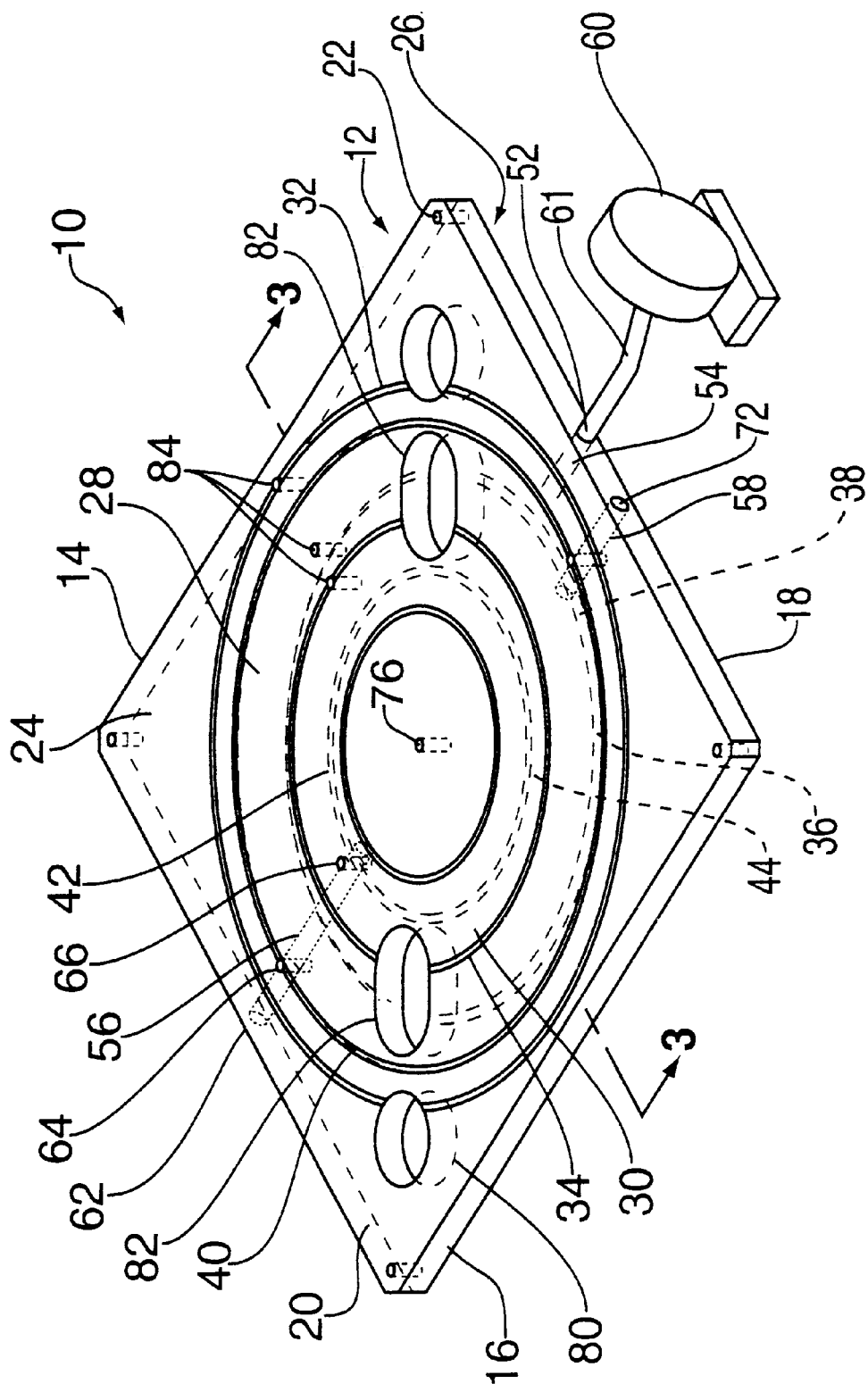
FIG. 1 is a perspective view of a vacuum chuck in accordance with the present invention.

Referring to FIG. 1, a vacuum chuck is illustrated and generally indicated at 10. Vacuum chuck 10 has a generally square body 12 having a pair of opposing first and second sides 14 and 16 and a second pair of opposing third and fourth sides 18 and 20 which define the generally square body 12. Body 12 may be made of any suitable material including a metal or an ESD (electro static discharge) material. In an exemplary embodiment, body 12 is made from aluminum or an epoxy glass compound. Body 12 includes a plurality of corner apertures 22 and in an exemplary, embodiment body 12 includes four corner apertures 22, each being located proximate the intersection of two adjoining sides. Corner apertures 22 are intended to permit body 12 to be attached to a fixture such as a tooling fixture which is typically used during either a testing procedure or a manufacturing process. To locate and secure body 12 to the fixture, corresponding pins or projections (not shown) from the fixture are received in corner apertures 22 and effectively secure body 12 in place on a receiving surface of the fixture.

Figure 3:
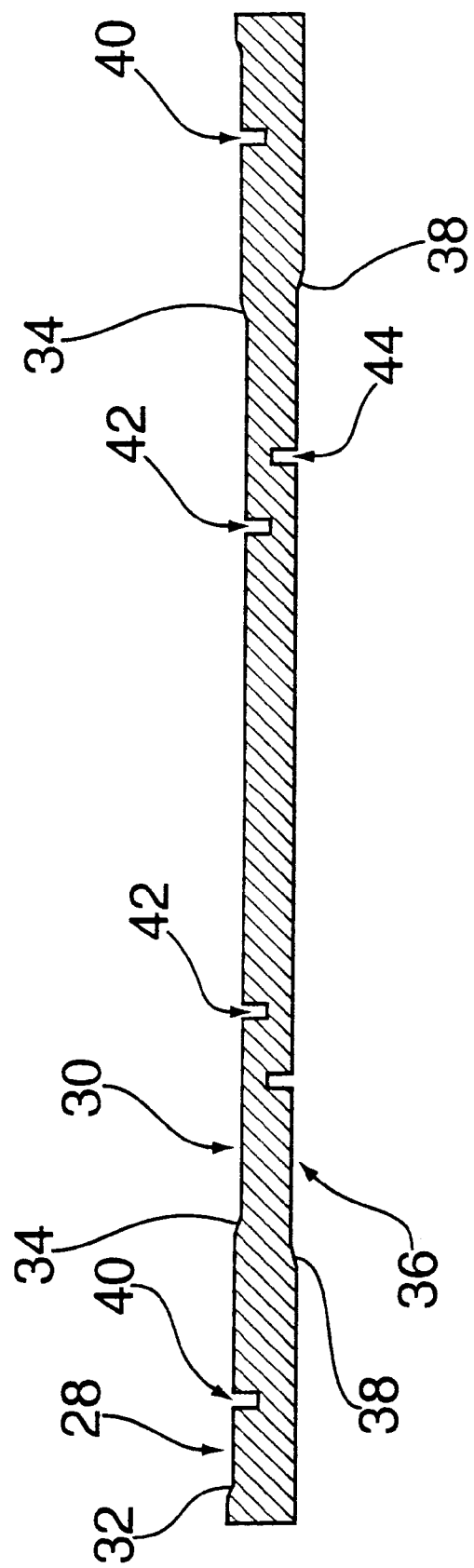
FIG. 3 is a cross sectional view of the vacuum chuck taken along the line 3—3 of FIG. 1.
Figure 4:
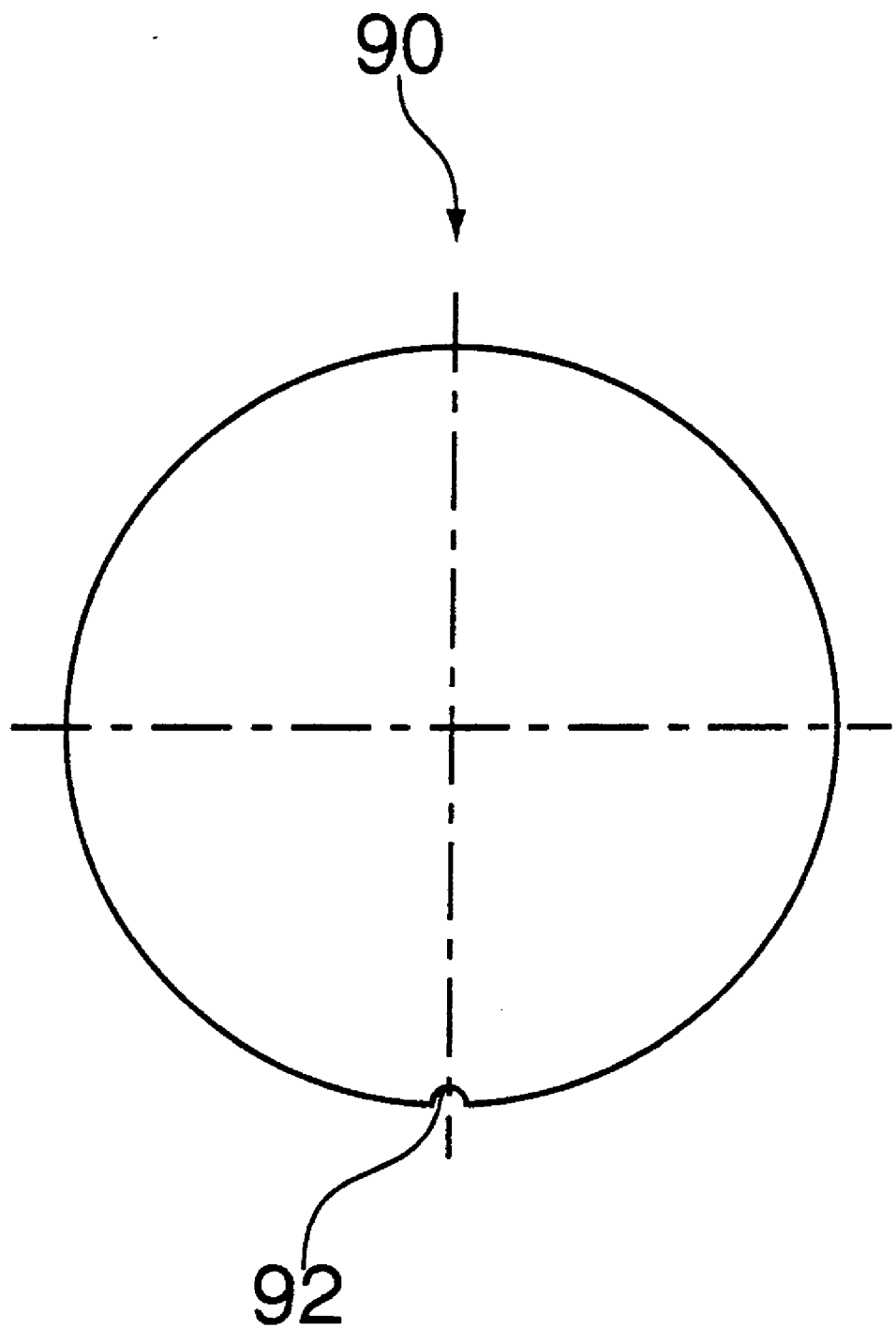
FIG. 4 is a top plan view of a shim for use with the vacuum chuck of FIG. 1, FIG. 4 also illustrates a typical shape of a wafer for use within the vacuum chuck of FIG. 1.

Body 12 has a first surface 24 and a second opposing surface 26 and in accordance with the present invention, first surface 24 is designed to receive at least two different wafer sizes and second surface 26 is designed to receive at least one wafer size. As shown in more detail in FIG. 3, first surface 24 includes a first circular platform 28 and a second circular platform 30, wherein in an exemplary embodiment, first circular platform 28 receives a wafer having a first diameter and second circular platform 30 receives a wafer having a second diameter (exemplary wafer shapes are illustrated in FIG. 4). First circular platform 28 comprises a recessed circular surface generally in the form of a ring formed by a first annular shoulder 32 and a second annular shoulder 34. The outer periphery of first circular platform 28 is defined by first annular shoulder 32 and the inner periphery of first circular platform 28 is defined by second annular shoulder 34. It being understood that first circular platform 28 is slightly recessed in relation to first surface 24 of vacuum chuck 10.

Second circular platform 30 also comprises a step-down portion formed in first surface 24, wherein second circular platform 30 is also generally circular in nature where the outer periphery of second circular platform 30 is defined by second annular shoulder 34. Consequently, second circular platform 30 is recessed in relation to both first circular platform 28 and first surface 24.

In an exemplary embodiment, first circular platform 28 receives and holds an 8 inch diameter wafer (first diameter wafer) (not shown). The outer peripheral edge of the wafer is designed to abut against the bottom edge of first annular shoulder 32 so that the wafer seats flush against first circular platform 28 and more specifically the ring defined thereby. Similarly, second circular platform 30 receives and holds a 5 inch diameter wafer (second diameter wafer) (not shown). The outer peripheral edge of the 5 inch wafer abuts against the bottom edge of second annular shoulder 34 so that the wafer seats flush against second circular platform 30. It being understood that both first and second circular platforms 28 and 30 provide wafer relief by acting as a support surface for the wafer to rest upon during the testing or manufacturing operations. Because second circular platform 30 is stepped-down from first circular platform 28, when a wafer is disposed on first circular platform 28, the wafer will lie flush against only the first circular platform 28 and not against second circular platform 30 which extends below first circular platform 28. Thus, a pocket of air forms within second circular platform 30 beneath a wafer placed upon first circular platform 28.

In a similar manner, second surface 26 of chuck 10 includes a single third circular platform 36 (a first circular platform of second surface 26) for receiving and holding a wafer having a third diameter (not shown). In an exemplary embodiment as shown in FIG. 3 and for purpose of illustration only, the third diameter is an intermediate wafer diameter which is greater than the second diameter but less than the first diameter. Third circular platform 36 generally comprises a recessed circular surface where the outer periphery of the circle is defined by a third annular shoulder 38 formed in second surface 26, and wherein third circular platform 36 is stepped-down from the remaining portion of second surface 26 which surrounds third circular platform 36 and extends to the sides of vacuum chuck 10. In an exemplary embodiment, third circular platform 36 receives and holds a 6 inch diameter wafer, the outer peripheral edge of which abuts against the bottom edge of third annular shoulder 38 to permit the wafer to seat flush against platform 36. The precise shape of first, second, and third platform 28, 30, and 36 is largely dictated by the shape of the wafer which is received therein, and typically, most conventional wafers are generally circular in nature. That being said, it is within the scope of the present invention that first, second, and third platforms 28, 30, and 36 may have alternative shapes which are complementary to the wafer being disposed therein.

Figure 2:
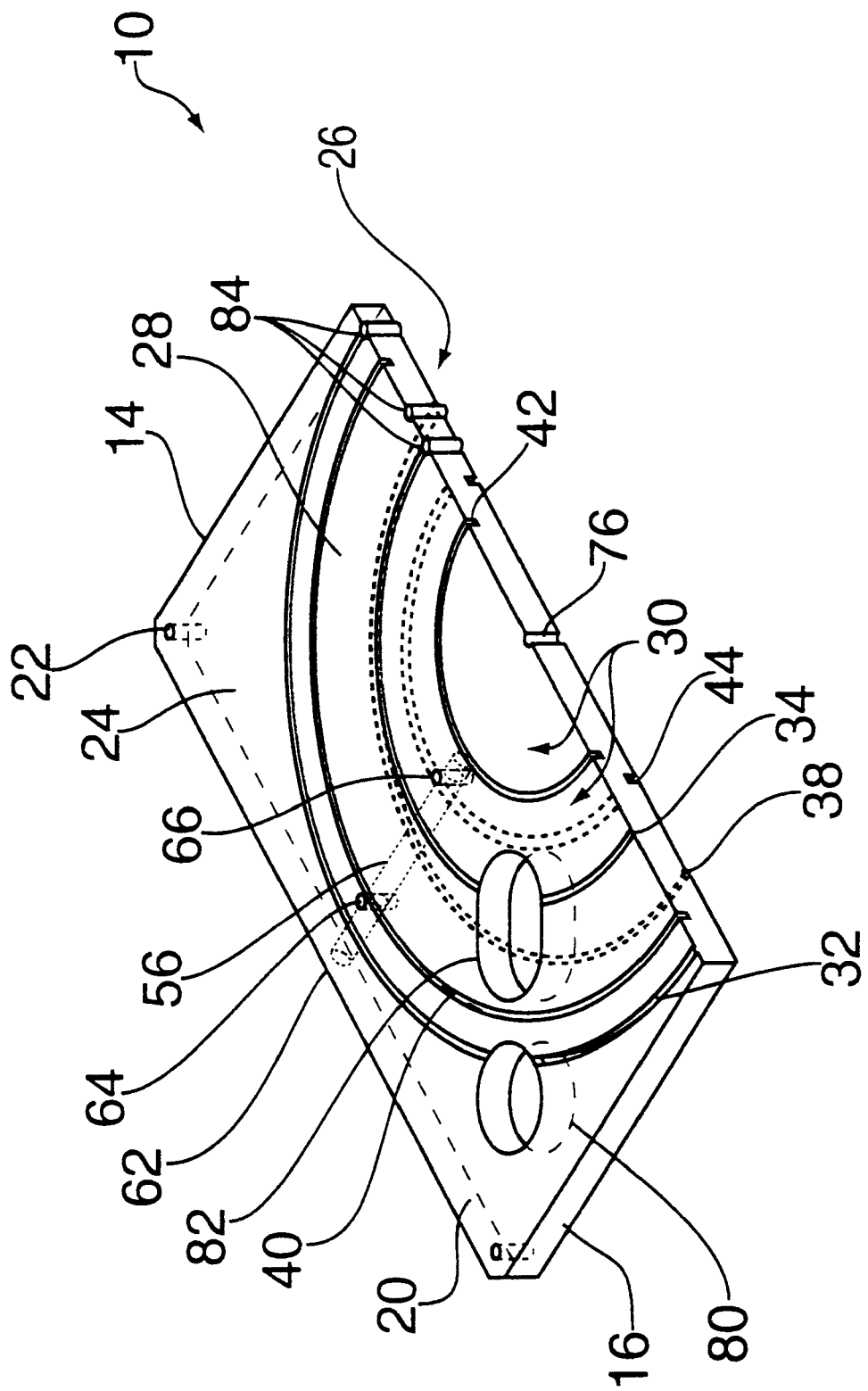
FIG. 2 is a partial perspective view illustrating the vacuum chuck sectioned thru the center.

Referring to FIGS. 1–3, vacuum chuck 10 includes first, second, and third vacuum troughs 40, 42, and 44. First and second vacuum troughs 40 and 42 are formed in first surface 24 and generally comprise circular grooves. First vacuum trough 40 is formed in first circular platform 28 proximate first annular shoulder 32. The dimensions of first vacuum trough 40 are not critical to the present invention; however, first vacuum trough 40 is typically formed in first circular platform 28 so that the width of first vacuum trough 40 is minimized without sacrificing vacuum performance. By minimizing the width of first vacuum trough 40, the support offered by first circular platform 28 is not sacrificed and a solid planar platform for holding the wafer is provided thereby. In one exemplary embodiment, first vacuum trough 40 has a depth of approximately 0.125 inches and a width of approximately 0.063 inches. First vacuum trough 40 is intended to extend under a wafer resting upon first circular platform 28 so that first vacuum trough 40 acts to hold the wafer in place. Similarly, second vacuum trough 42 is formed in first surface 24 and more specifically is formed in second circular platform 30. The width of second vacuum trough 42 is also minimized and in one exemplary embodiment, second vacuum trough 42 has a depth of approximately 0.125 inches and a width of approximately 0.063 inches. Second vacuum trough 42 is intended to extend under a wafer resting upon second circular platform 30.

On opposing second surface 26 of vacuum chuck 10, third vacuum trough 44 is formed in third circular platform 36. Second vacuum trough 42 and third vacuum trough 44 are preferably not axially aligned with respect to one another, as will be described in greater detail hereinafter. Third vacuum trough 44 is intended to extend under a wafer resting upon third circular platform 36 formed in second surface 26 of vacuum chuck 10. In an exemplary embodiment, third vacuum trough 44 has a depth of approximately 0.125 inches and a width of approximately 0.063 inches. It being understood that the dimensions of vacuum troughs 40, 42, and 44 are listed for purpose of illustration only and it is within the scope of the present invention that the dimensions may vary depending upon the precise application of vacuum chuck 10 and upon other factors.

Vacuum chuck 10 further includes at least one internal vacuum passageway which extends from the interior portions of body 12 to an exterior first vacuum port 52 located at one of the sides of vacuum chuck 10. In an exemplary embodiment and as shown in FIGS. 1–2, vacuum chuck 10 includes three internal vacuum passageways, namely a first vacuum passageway 54, a second vacuum passageway 56, and a third vacuum passageway 58. In this embodiment, each vacuum passageway corresponds to a single vacuum trough and links the respective vacuum trough to a vacuum source 60. First vacuum passageway 54 extends from a first vacuum port 52 to first vacuum trough 40 so that first vacuum trough 40 opens into first vacuum passageway 54 and air may be evacuated through first vacuum trough 40 through first vacuum passageway 54 to hold the wafer on first circular platform 28. First vacuum passageway 54 is formed by methods known in the art, including a drilling process. The dimensions of first vacuum passageway 54 are not critical to the practice of the present invention so long as it is sized to permit sufficient vacuum force resulting in the secure holding of the wafer against first circular platform 28. Preferably, first vacuum passageway 54 comprises a generally horizontal passageway parallel to first and second surfaces 24 and 26.

Similarly, second vacuum passageway 56 extends from a second vacuum port 62 to second vacuum trough 42 so that second vacuum trough 42 opens into second vacuum passageway 56 and air may be evacuated through second vacuum trough 42 and through second vacuum passageway 56 to hold the wafer on second circular platform 30. Unlike first vacuum passageway 54, second vacuum passageway 56 includes a first plug 64 which extends vertical thereto through first vacuum trough 40 to prevent air from being evacuated through first vacuum trough 40 when vacuum source 60 is actuated to evacuate air from second vacuum trough 42. Preferably, before second vacuum passageway 56 is formed, first plug 64 is inserted into vacuum chuck 10 by forming a vertical opening in body 12 through first vacuum trough 40. After forming the vertical opening, the opening is plugged by disposing first plug 64 within the vertical opening. Preferably, first plug 64 is formed of the same material as vacuum chuck 10 (e.g., aluminum); however, it is within the scope of the present invention that any suitable material may be used. First plug 64 is intended to plug first vacuum trough 40 so that when second vacuum passageway 56 is formed in body 12, it links only the second vacuum trough 42 to vacuum source 60. It being understood that the dimensions of first plug 64 are such that when first plug 64 is inserted into first vacuum trough, it does not interfere with the air evacuation of first vacuum trough 42 when trough 42 is actuated. To accomplish this, first plug 64 is recessed below the depth of first vacuum trough 40 so that first vacuum trough has a continuous and uninterupted trough for air evacuation. In other words, first plug 64 does not extend into first vacuum trough 42 to form an obstruction therein. In forming second vacuum passageway 56, a center opening is formed in first plug 64 during the process, however, the remaining portions of first plug 64 block any air evacuation from second vacuum passageway 56 during evacuation of first vacuum trough 40. Likewise, a vertical opening is formed in body 12 through third vacuum trough 44 of second surface 26. After forming this vertical opening, the opening is plugged by disposing a second plug 66 within the vertical opening. Second plug 66 is intended to plug third vacuum trough 44 so that when second vacuum passageway 56 is formed in body 12, it links only the second vacuum trough 42 to vacuum source 60. It being understood that when second passageway 56 is formed it extends through and opens all three vacuum troughs 40, 42, 44, and therefore to isolate second vacuum trough 42, the other vacuum troughs 40 and 44 are plugged. The plugs being inserted into vacuum troughs 40 and 44 do not interfere with the air evacuation of vacuum troughs 40 and 44 when they are actuated because the plugs are recessed below the depth of vacuum troughs 40 and 44 so that vacuum troughs 40 and 44 are continuous and uninterupted.

In order to isolate and link third vacuum trough 44 to vacuum source 60, a third vacuum passageway 58 extends from a third vacuum port 72 to third vacuum trough 44 so that third vacuum trough 44 opens into third vacuum passageway 58 and air is evacuated through third vacuum trough 44 and third vacuum passageway 58 to hold the wafer on the third circular platform 36. Preferably, before third vacuum passageway 58 is formed, a first plug 64 is inserted into vacuum chuck 10 by forming a vertical opening in body 12 through first vacuum trough 40 at the location where first vacuum trough 40 will intersect third vacuum passageway 58, wherein the opening extends through body 12. After forming the vertical opening, the opening is plugged by disposing first plug 64 therein to prevent air from flowing into third vacuum passageway 58 from first vacuum trough 40. As previously described, first plug 64 is recessed relative to first vacuum trough 40 so that first vacuum trough is continuous and uninterupted. Subsequently, third vacuum passageway 58 is formed by known methods.

The precise location of first, second, and third vacuum passageways 54, 56 and 58 is not critical and the purpose of having three separate vacuum passageways is that it permits selectivity by the user in which vacuum trough is to be connected to vacuum source 60. It being understood that the vacuum trough which is disposed beneath the wafer lying on one of the circular platforms is the one vacuum trough which needs to be linked to vacuum source 60 so that air is evacuated from this vacuum trough and the wafer is held to the respective circular platform. It is within the scope of the present invention that all three vacuum passageways may be actuated and linked to vacuum source during any given application resulting in the possible placement of the wafer on any of the circular platforms.

Vacuum ports 52, 62, and 72 preferably each include a nozzle (not shown) which permits vacuum source 60 to be easily connected to the respective vacuum passageway. A vacuum coupling pipe or tube 61 connects the nozzle to vacuum source 60, such as a vacuum pump to produce a vacuum at each vacuum trough when vacuum source 60 is actuated.

First, second, and third vacuum passageways 54, 56, and 58 are formed by methods known in the art, including a drilling process. The dimensions of each vacuum passageway are not critical to the practice of the present invention so long as each vacuum passageway is sized to permit sufficient evacuation of air resulting in the secure holding of the wafer against the respective circular platform.

Referring to FIGS. 1 and 2, located at the center of body 12 is a center venting port 76 which is designed to vent any air which is present under the center portion of a wafer (not shown) when the wafer is placed on body 12, and more specifically when the wafer is placed on any one of receiving platforms 28, 30, and 36. When the wafer is initially received in a respective receiving platform, there is a certain amount of air at ambient atmosphere conditions which is trapped between the bottom surface of the wafer and the corresponding platform. In many instances when a vacuum system is actuated and applied to a vacuum chuck for evacuating air through vacuum troughs, this air trapped between the two surfaces will cause the wafer to warp and bulge at this location due to the trapped air. This is especially true for second circular receiving platform 30 because the wafer is seated flush against a circular surface which does not include any ports or openings to permit air flow resulting in a venting action.

Vacuum chuck 10 also includes at least one first finger relief 80 corresponding to first circular platform 28 and at least one second finger relief 82 corresponding to second circular platform 28 and third circular platform 36. More specifically, first finger relief 80 comprises an opening extending through body 12 which is sized to permit a wafer removing device (not shown) to be inserted beneath the wafer on first circular platform 28 after vacuum source 60 is turned off and the vacuum is broken. As is known in the art, an exemplary wafer removing device is a vacuum spatula designed to be inserted beneath the wafer between the wafer and first circular platform 28 permitting easy and careful removal of the wafer from vacuum chuck 10. In one exemplary and as shown in FIG. 1, vacuum chuck 10 includes a pair of first finger reliefs 80 which generally oppose one another on opposite sides of vacuum chuck 10. The dimensions and shape of first finger relief 80 are not critical and one suitable shape, as shown, for first finger relief 80 is a circle. Because first finger relief 80 provides access to the wafer itself, a portion of first finger relief 80 is formed in first annular shoulder 32 resulting in first annular shoulder not being entirely continuous and uninterrupted in nature.

In one exemplary embodiment which is shown in FIG. 1, second finger relief 82 comprises an opening extending through body 12 which permits access to and removal of a wafer disposed either on second circular platform 30 or third circular platform 36. In this embodiment, second finger relief 82 is located so that the opening extends within at least a portion of both second circular platform 30 and third circular platform 36 so that depending upon whether first surface 24 or second surface 26 is facing upward away from the fixture to which vacuum chuck 10 is mounted, access to second circular platform 30 and third circular platform 36, respectively, is provided. Similar to first finger relief 80, second finger relief 82 preferably comprises a pair of openings formed in body 12 which generally oppose one another on opposite sides of vacuum chuck 10. The dimensions and shape of second finger relief 82 are not critical so long as it provides suitable access to platforms 30 and 36 and one suitable form, as shown in FIG. 1, for second finger relief 82 is a generally oval shape opening. Because second finger relief 82 provides access to a wafer disposed on either platform 30 or 36, a portion of second finger relief 82 is formed in both second and third annular shoulders 34 and 38, as shown.

It being understood that it is within the scope of the present invention that a third finger relief (not shown) separate from second finger relief 82 may be provided to permit easy removal of a wafer disposed within third circular platform 36. In this alternative embodiment, no portion of the third finger relief opening is formed in second circular platform 30 but instead at least a portion of the third finger relief is formed in third annular shoulder 38.

Vacuum chuck 10, and more specifically each circular platform, includes an alignment pin 84 for localized alignment of a wafer within the respective circular platform formed in vacuum chuck 10. It is important that the height of each alignment pin 84 be such that alignment pin 84 does not extend above the topmost edge of the adjacent annular shoulder. For example, in the case of alignment pin 84 disposed in second circular platform 30, the pin does not extend into the horizontal plane defined by first circular platform 28 because this would prevent a wafer from lying flush against first circular platform 28. In the case of the separate alignment pins 84 disposed within both first circular platform 28 and third circular platform 36, the pins are sized so that they do not extend into the plane defined by first surface 24 or second surface 26, respectively, so that each of these surfaces may lie flush against the receiving surface of the fixture to which vacuum chuck 10 is mounted.

Preferably, each alignment pin 84 is located at a corresponding annular shoulder in each of the circular platforms, wherein alignment pin 84 is centered on the annular shoulder so that a portion of alignment pin 84 extends into the circular platform for engaging a similarly shaped notch in a wafer disposed within the circular platform. Thus, the wafer is conveniently and locally aligned within each circular platform by engaging the notch of the wafer with alignment pin 84.

By aligning the wafer within the respective circular platform, a coordinate system may be established for easing locating a specific point or location on the wafer. This is important during a testing procedure in which probes are applied to the wafer and guided along the surface thereof to check for visual defects in the wafer itself. The wafer is also typically exposed to other testing and inspection procedures which evaluate the quality of the wafer before or after the wafer has been used in a predetermined application. Many testing and inspection procedures involve the use of computer driven devices, e.g., probes, which are positioned and travel around the wafer by using a coordinate system. For example, a tooling device may be required to be positioned and driven to various alignment points on the wafer to perform various tooling operations.

Now turning to FIG. 4, which illustrates a shim 90 to be disposed within second circular platform 30 of vacuum chuck 10. In contrast to vacuum chuck 10 of FIGS. 1–3, the use of shim 90 permits vacuum chuck 10 to have complete wafer support on both first surface 24 and second surface 26. Shim 90 includes a notch 92 formed therein to receive alignment pin 84 so that shim 90 may be disposed flush against second circular platform 30.

The use of shim 90 eliminates the recess in first surface 24 which is formed by second circular platform 30 and thus, first circular platform 28 does not include a recessed center portion (second circular platform 30). As a result, when shim 90 is disposed in the center of first circular platform 28, first circular platform 28 has increased wafer support, compared with vacuum chuck 10 because the surface area upon which the wafer rests against is increased. Accordingly by eliminating the recessed centered portion in first circular platform 28 with the use of shim 90, the first diameter wafer rests flush against the entire surface of first circular platform 28. This results in added support for the first diameter wafer and permits a greater variety of testing and manufacturing procedures to be conducted on the first diameter wafer, especially those procedures which require additional force to be applied to the wafer.

Thus, vacuum chuck 10 is designed to receive two different size wafers, a first diameter wafer is received in first circular platform 28 formed in first surface 24 and a second diameter wafer is received in third circular platform 36 on second surface 26.

It also being understood that the shape of shim 90 resembles the shape of an exemplary wafer for use with vacuum chuck 10 of the present invention.

Figure 5:
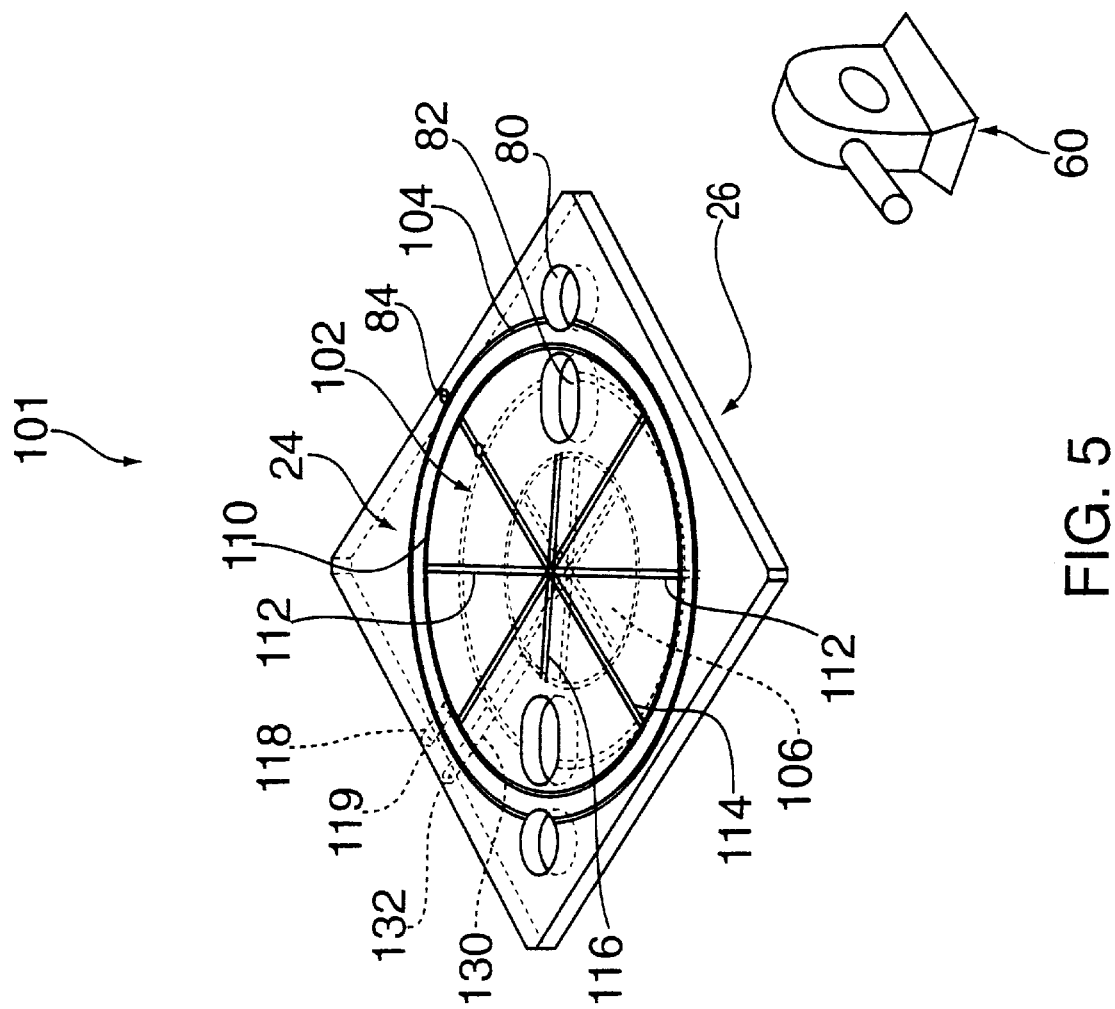
FIG. 5 is a top perspective view of a second embodiment of a vacuum chuck in accordance with the present invention.
Figure 6:
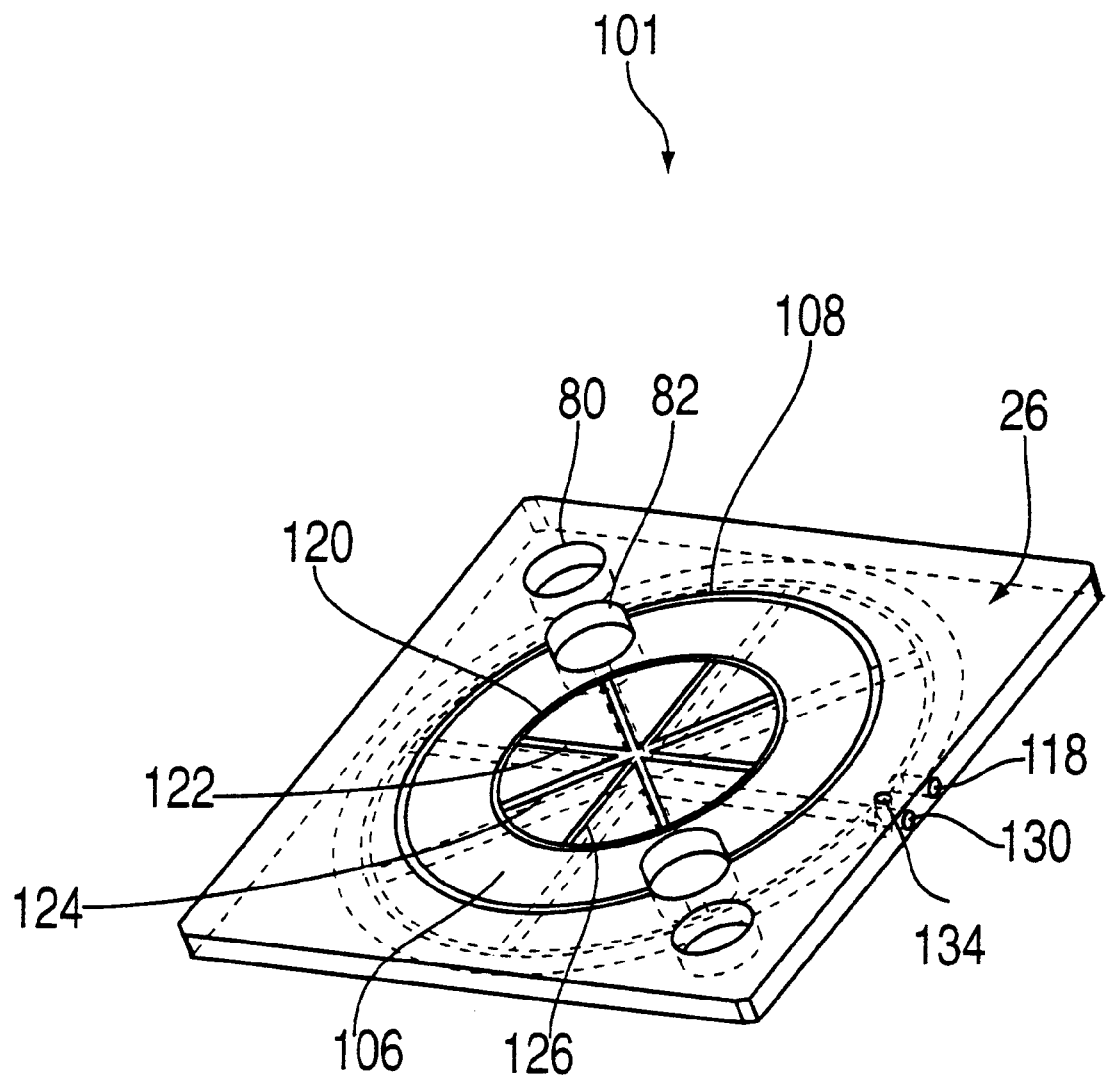
FIG. 6 is a bottom perspective view of the vacuum chuck of FIG. 5.

Now turning to FIGS. 5–6, which illustrate a second embodiment of a vacuum chuck, generally indicated at 101. Vacuum chuck 101 is similar to vacuum chuck 10 with like features being numbered alike. On first surface 24, a first circular platform 102 is formed therein, wherein first circular platform 102 receives a wafer having a first diameter. First circular platform 102 comprises a recessed circular surface in which the outer periphery is defined by a first annular shoulder 104. In an exemplary embodiment, first circular platform 102 receives an 8 inch diameter wafer; however, it is understood that first circular platform 102 may be sized to receive wafers of other diameters. When the wafer is securely disposed within first circular platform 102, the outer peripheral edge of the wafer abuts against the bottom edge of first annular shoulder 104 to permit the wafer to seat flush against first circular platform 102.

In a similar manner, second surface 26 of vacuum chuck 101 includes a second circular platform 106 for receiving and holding a wafer having a second diameter. In an exemplary embodiment, the second diameter wafer comprises a 6 inch wafer. Second circular platform 106 generally comprises a recessed circular platform formed in second surface 26 where the outer periphery of second circular platform 106 is defined by a second annular shoulder 108 formed in second surface 26. When a wafer is securely disposed within second circular platform 106, the outer peripheral edge of the wafer abuts against the bottom edge of second annular shoulder 108 to permit the wafer to seat flush against second circular platform 106.

Vacuum chuck 101 includes a first circular vacuum trough 110 formed in first surface 24 proximate first annular shoulder 104. A plurality of radial vacuum troughs 112, 114, and 116 extend between first circular vacuum trough 110, wherein in the exemplary embodiment illustrated, vacuum troughs 112 and 114 intersect first circular vacuum trough 110. In a preferred embodiment, the plurality of vacuum troughs 112, 114, and 116 pass trough a center point of first circular platform 102 forming a plurality of pie-like slices, each defined by two vacuum troughs. Radial vacuum trough 116 extends between second finger relief 82 and does not intersect first circular vacuum trough 110.

In one exemplary embodiment, vacuum troughs 110, 112, 114, and 116 have a depth of approximately 0.125 inches and a width of approximately 0.063 inches. Vacuum troughs 110, 112, 114, and 116 are intended to under a first diameter wafer resting upon first circular platform 102 so that vacuum troughs 110, 112, 114, and 116 act to hold the wafer in place. To accomplish this, a first internal vacuum passageway 118 extends from the interior portions of the body of vacuum chuck 110 to a first exterior vacuum port 119 located at one of the sides of vacuum chuck 101. First internal vacuum passageway 118 links vacuum troughs 110, 112, 114, and 116 to vacuum source 60. Because radial vacuum troughs 112, 114, and 116 intersect at a common center point and at least one and preferably two or more of the radial vacuum troughs intersect with and communicate with first circular vacuum trough 110, air may be evacuated from all of the vacuum troughs through first internal vacuum passageway 118 when vacuum source 60 is actuated. More specifically, in this second embodiment, first internal vacuum passageway 118 extends from first exterior vacuum port 119 to first circular vacuum trough 110.

In a similar manner, vacuum chuck 101 includes a second circular vacuum trough 120 formed in second circular platform 106 of second surface 26 proximate second annular shoulder 108. A plurality of radial vacuum troughs 122, 124, and 126 extend between second circular vacuum trough 120, wherein in the exemplary embodiment illustrated, vacuum troughs 122, 124, and 126 intersect second circular vacuum trough 120. In a preferred embodiment the plurality of vacuum troughs 122, 124, and 126 pass trough a center point of second circular platform 106 forming a plurality of pie-like slices, each defined by two vacuum troughs. Radial vacuum troughs 122, 124, and 126 extend between second finger relief 82 and are generally axially aligned with the corresponding and similar radial vacuum troughs 112, 114, and 116 formed on opposite first surface 24.

In one exemplary embodiment, vacuum troughs 120, 122, 124, and 126 have a depth and a width similar to that of the vacuum troughs formed in first surface 24. Vacuum troughs 110, 112, 114, and 116 are intended to extend under a second diameter wafer resting upon second circular platform 106 so that vacuum troughs 120, 122, 124, and 126 act to hold the wafer in place. To accomplish this, a second internal vacuum passageway 130 extends from the interior portions of the body of vacuum chuck 101 to a second exterior vacuum port 132 located at one of the sides of vacuum chuck 100. Second internal vacuum passageway 130 links vacuum troughs 120, 122, 124, and 126 to vacuum source 60. Because radial vacuum troughs 122, 124, and 126 intersect at a common center point and intersect with and communicate with second circular vacuum trough 120, air may be evacuated from all of the vacuum troughs through second internal vacuum passageway 130 when vacuum source 60 is actuated. More specifically, in this second embodiment, second internal vacuum passageway 130 extends from second exterior vacuum port 132 to second circular vacuum trough 120.

Unlike first internal vacuum passageway 118, second internal vacuum passageway 130 preferably includes a first plug 134 which extends generally perpendicular to second internal vacuum passageway 130 to prevent air from being evacuated from first circular trough 110 and the radial vacuum troughs 112, 114, and 116 in communication therewith when vacuum source 60 is actuated. Accordingly, before second internal vacuum passageway 130 is formed, first plug 134 is inserted into vacuum chuck 101 by forming a vertical opening in the body of vacuum chuck 101 through first circular trough 110. After forming the vertical opening, the opening is plugged by disposing first plug 134 within the vertical opening. First plug 134 is intended to plug first circular trough 110 so that when second internal vacuum passageway 130 is formed in vacuum chuck 101, it links only second circular trough 120 to vacuum source 60. In forming second internal vacuum passageway 130, a center opening is formed in first plug 134 during the process; however, the remaining portions of first plug 134 block any air flow from first circular trough 110.

Advantageously, vacuum chuck 101 provides additional vacuum troughs which are evacuated upon actuation of vacuum source 60 resulting in more vacuum trough surface area in contact with the wafer and therefore more vacuum force acting upon the wafer to securely hold it in place.

Figure 7:
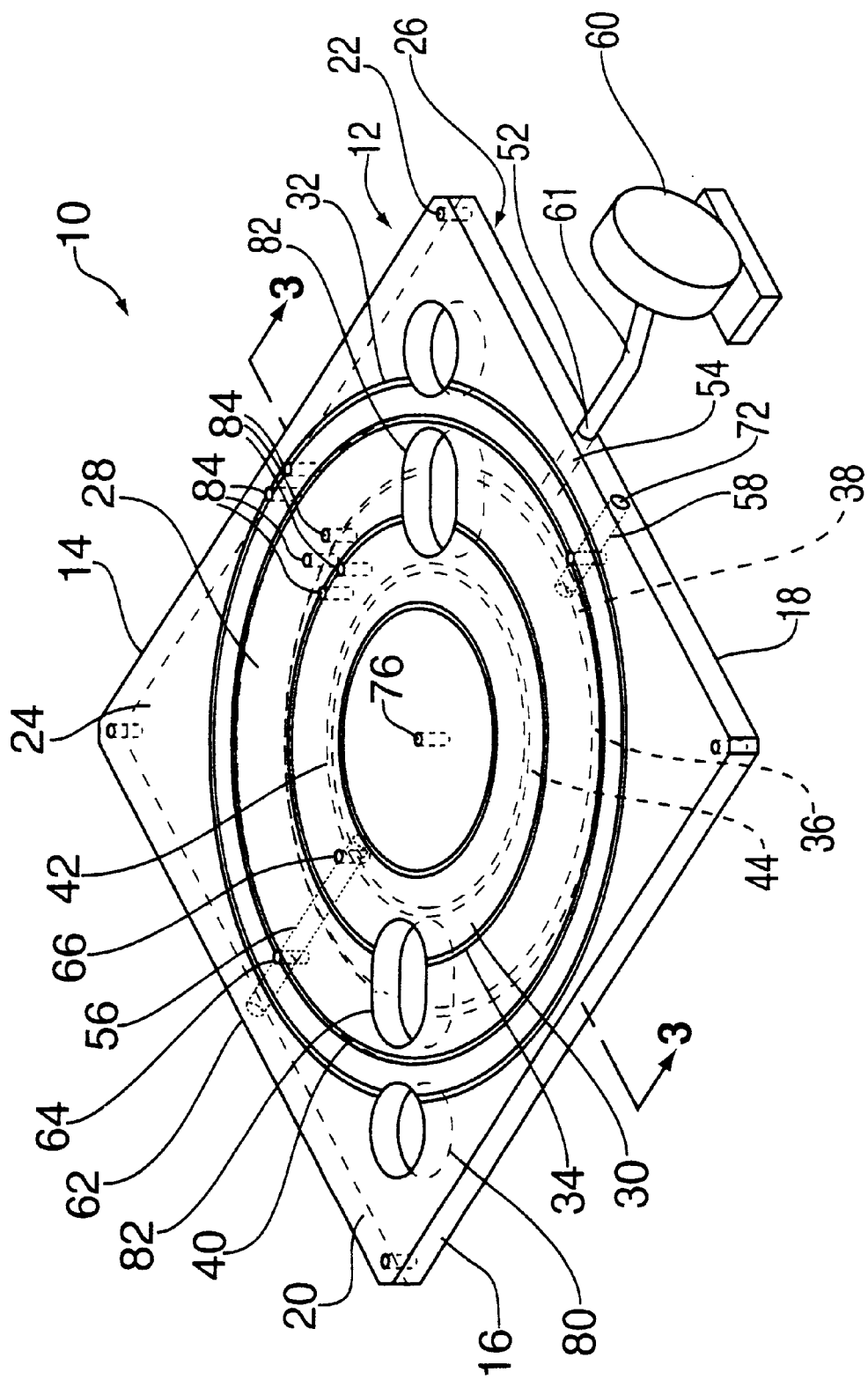
FIG. 7 is a top perspective view of a third embodiment of a vacuum chuck in accordance with the present invention.
Figure 8:
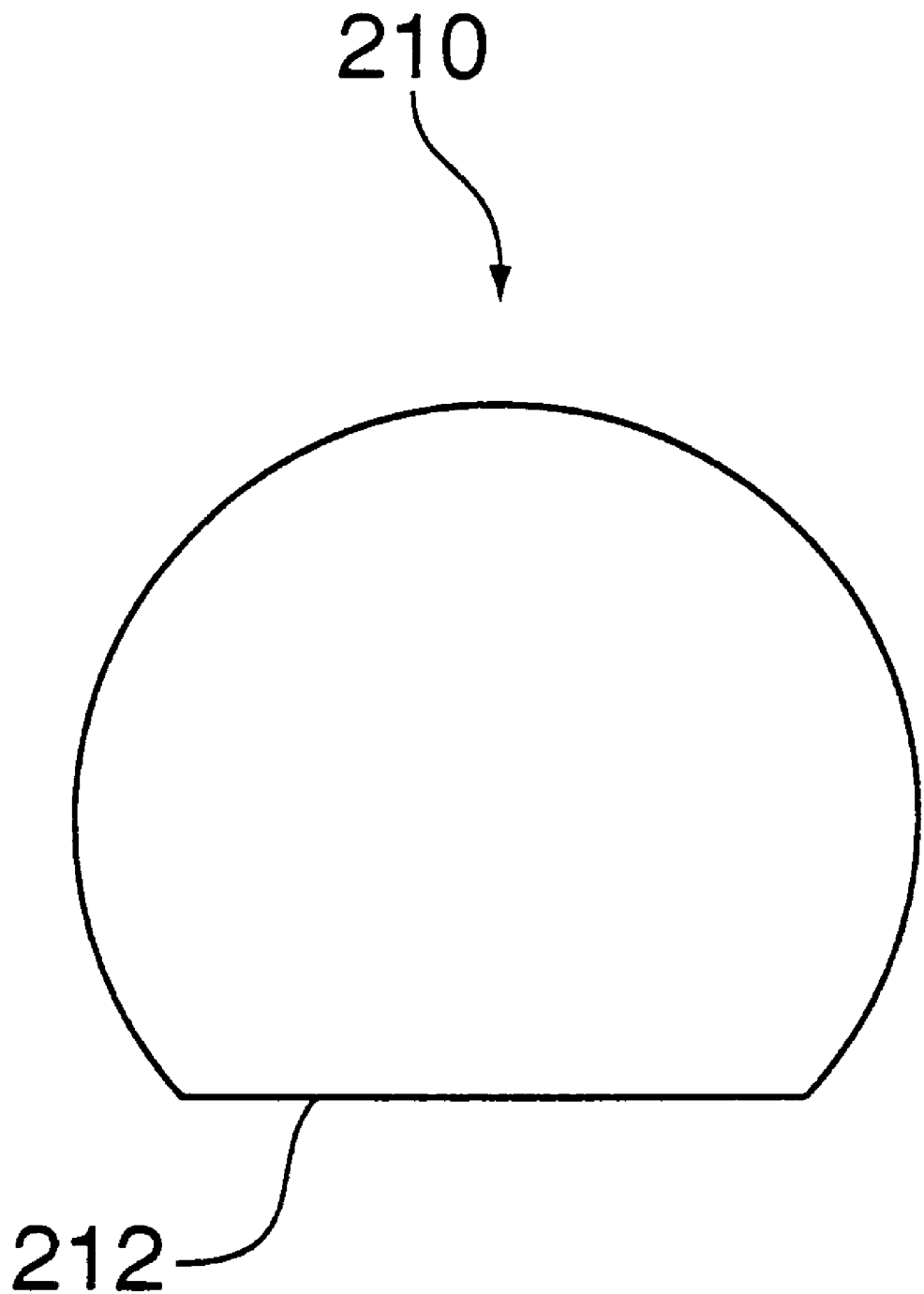
FIG. 8 is a top plan view of an exemplary embodiment of a wafer for use with the vacuum chucks of FIGS. 7 and 9.

Now turning to FIGS. 7–8, which illustrate a third embodiment of a vacuum chuck, generally indicated at 200. Vacuum chuck 200 is similar to vacuum chuck 10 with like features being numbered alike. In this embodiment, two pairs of alignment pins 84 are provided in each of circular platforms 28, 30, and 36. More specifically, each one of platforms 28, 30, and 36 includes a pair of spaced alignment pins 84 for localized alignment of a wafer 210 shown in FIG. 8. Wafer 210 shown in FIG. 8 comprises an alternative embodiment illustrating a different wafer shape. In this embodiment, alignment pins 84 are not necessarily located at a corresponding annular shoulder of each of circular platforms 28, 30, and 36 and as illustrated, alignment pins 84 may be located slightly away from the annular shoulder. It being understood that the purpose of each pair of alignment pins 84 within each circular platform is to located and help secure and hold wafer 210 in proper position. Wafer 210 is generally circular in shape with the exception that wafer 210 includes a cut edge 212 which is comprises a planar edge formed in wafer 210. When wafer 210 is disposed in any of platforms 28, 30, and 36, cut edge 212 abuts against a pair of alignment pins 84 which locate and help hold wafer 210 in position. As shown in FIG. 7, each pair of alignment pins 84 is disposed within a plane which cooperates within the plane of cut edge 212 so that the two planes abut each other when wafer 210 is disposed in one of circular platforms 28, 30, and 36.

Figure 9:
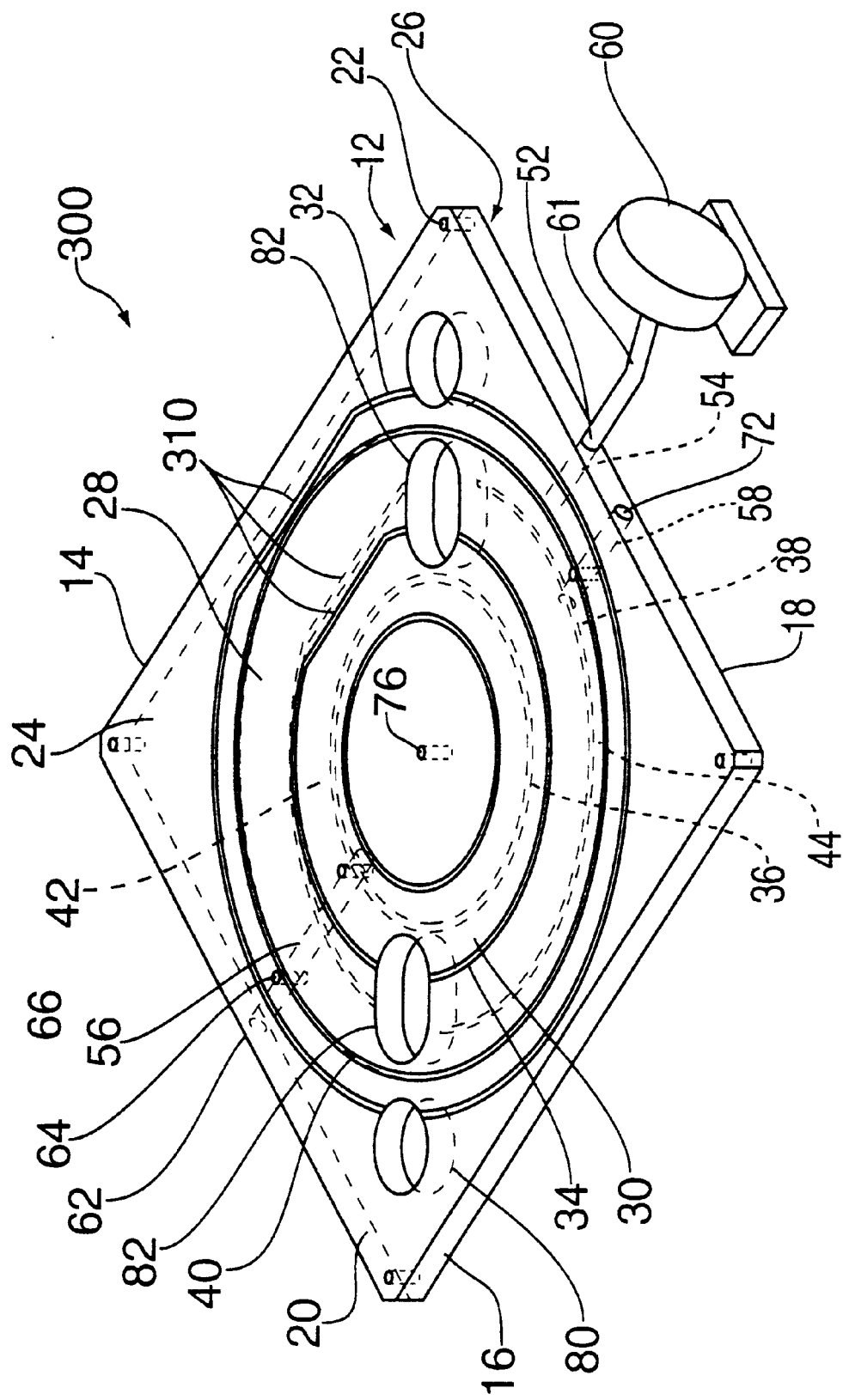
FIG. 9 is a top perspective view of a fourth embodiment of a vacuum chuck in accordance with the present invention.

Now turning to FIG. 9, which illustrates a fourth embodiment of a vacuum chuck, generally indicated at 300. Vacuum chuck 300 is similar to vacuum chuck 10 with like features being numbered alike. In this embodiment, annular shoulders 32, 34, and 38 include a planar edge 310 formed in each of annular shoulders 32, 34, and 38, wherein planar edge 310 generally corresponds to cut edge 212 of wafer 210 shown in FIG. 8. It being understood that vacuum chuck 300 is intended for use with wafer 210. When wafer 210 is disposed within one of platforms 28, 30, and 36, cut edge 212 of wafer 210 abuts against planar edge 310 which has similar length as cut edge 212 so that wafer 210 is located and securely held within the respective platform of vacuum chuck 300. Wafer 210 is still easily inserted and removed from one of platforms 28, 30, and 36 via first and second finger reliefs 80 and 82.

While preferred embodiments have been shown and described, various modifications and substitutions may be made hereto without departing from the spirit and scope of the invention. Accordingly, it is to be understood that the present invention has been described by way of illustrations and not limitation.

What is claimed is:

1. A dual sided vacuum chuck for holding and supporting multiple-sized wafers, comprising:
   a wafer support body having a first surface and an opposing second surface;
   a first recessed platform formed in said first surface, said first recessed platform for receiving and holding a wafer having a first set of dimensions;
   a second recessed platform formed in said second surface, said second recessed platform for receiving and holding a wafer having a second set of dimensions;
   a first vacuum trough formed within said first recessed platform;
   a second vacuum trough formed within said second recessed platform; and
   at least one vacuum channel connected to at least one of said first and second vacuum troughs.

2. The vacuum chuck as in claim 1, wherein said wafer having one of said first and second sets of dimensions comprises a single integrated circuit chip.

3. The vacuum chuck as in claim 1, wherein said wafer support body is adapted to hold and support a wafer comprising a single integrated circuit chip.

4. A dual sided vacuum chuck for holding and supporting multiple-sized wafers, comprising:
   a wafer support body having a first surface and an opposing second surface;
   at least one first platform formed within said first surface, said at least one first platform being sized and shaped to receive a wafer having a first set of dimensions;
   at least one first platform formed within said second surface, said at least one first platform of second surface being sized and shaped to receive a wafer having a second set of dimensions;
   a first vacuum trough formed within said at least one first platform of said first surface for holding said wafer having said first set of dimensions within said at least one first platform of said first surface;
   a second vacuum trough formed within said at least one first platform of said second surface for holding said wafer having said second set of dimensions within said at least one first platform of said second surface; and at least one vacuum channel connected to at least one of said first and second vacuum troughs, wherein said at least one vacuum channel connects to a vacuum source to evacuate air from said at least one of said first and second vacuum troughs connected thereto when said vacuum source is actuated.

5. The vacuum chuck as in claim 4, further including a second platform formed within said first surface, said second platform being sized and shaped to receive a wafer having a third set of dimensions.

6. The vacuum chuck as in claim 5, wherein said first and second platforms of said first surface are recessed relative to said first surface and said first platform of said second surface is recessed relative to said second surface wherein said first and second platforms of said first surface and said first platform of said second surface are circular in shape.

7. The vacuum chuck as in claim 5, further including a third vacuum trough formed in said second platform of said first surface for holding a wafer disposed within said second platform wherein the first vacuum trough is formed outsideof the second platform.

8. The vacuum chuck as in claim 7, wherein said first, second, and third vacuum troughs comprise circular vacuum troughs.

9. The vacuum chuck as in claim 5, wherein said first set of dimensions are defined by a diameter of 8 inches, said second set of dimensions are defined by a diameter of 6 inches, and said third set of dimensions are defined by a diameter of 5 inches.

10. The vacuum chuck as in claim 5, further including a plurality of alignment pins, wherein a single alignment pin is formed in each of said first and second platforms in said first surface and said first platform in said second surface to locate one of said wafers within one of said platforms.

11. The vacuum chuck as in claim 5, wherein said second platform of said first surface and said first platform of said second surface have circular shaped recessed areas.

12. The vacuum chuck as in claim 5, wherein an outer periphery of said first and second platforms of said first surface and said first platform of said second surface is defined by a first, second, and third shoulder, respectively, wherein each of said first, second, and third shoulders is substantially annular in shape except that a planar edge is formed in each of said first, second, and third annular shoulders.

13. The vacuum chuck as in claim 5, further including a plurality of alignment pins, wherein at least two alignment pins are formed in each of said first and second platforms of said first surface and said first platform of said second surface to locate one of said wafers within one of said platforms.

14. The vacuum chuck as in claim 4, wherein said first platform of said first surface comprises a ring having an outer periphery defined by a first annular shoulder and an inner periphery defined by a second annular shoulder.

15. The vacuum chuck as in claim 4, wherein said at least one vacuum channel comprises a first vacuum channel, a second vacuum channel, and a third vacuum channel, said first vacuum channel extending from a periphery of said support body to said first vacuum trough, said second vacuum channel extending from said periphery to said second vacuum trough, said third vacuum channel extending from said periphery to said third vacuum trough.

16. The vacuum chuck as in claim 15, wherein said first, second, and third vacuum channels are coupled to a single vacuum source.

17. A dual sided vacuum chuck for holding and supporting multiple-sized wafers, comprising:

a wafer support body having a first surface and an opposing second surface;

a first recessed platform formed in said first surface, said first recessed platform for receiving and holding a wafer having a first set of dimensions;

a second recessed platform formed in said second surface, said second recessed platform for receiving and holding a wafer having a second set of dimensions;

a first vacuum trough formed within said first recessed platform;

a plurality of first radial vacuum troughs formed in said first recessed platform extending between said first vacuum trough;

a second vacuum trough formed within said second recessed platform;

a plurality of second radial vacuum troughs formed in said second recessed platform extending between said second vacuum trough; and at least one vacuum channel formed in said support body and connected to at least one of said first and second vacuum troughs.

18. The vacuum chuck as in claim 17, wherein said first and second vacuum troughs comprise circular vacuum troughs.

19. The vacuum chuck as in claim 18, wherein said first circular vacuum trough has a diameter greater than the diameter of said second circular vacuum trough.

20. The vacuum chuck as in claim 17, wherein said plurality of first radial vacuum troughs intersect at a center point of said first circular platform and at least some of said radial vacuum troughs intersect said first circular vacuum trough.

21. The vacuum chuck as in claim 17, wherein said plurality of second radial vacuum troughs intersect at said center point and at least some of said radial vacuum troughs intersect said second circular vacuum trough.

22. The vacuum chuck as in claim 17, wherein said at least one vacuum channel comprises a first vacuum channel and a second vacuum channel, said first vacuum channel extending from a periphery of said support body to said first vacuum trough, said second vacuum channel extending from said periphery to said second vacuum trough.

* * * * *